US010804956B2

(12) United States Patent
Manian et al.

(10) Patent No.: US 10,804,956 B2
(45) Date of Patent: Oct. 13, 2020

(54) BIDIRECTIONAL DATA LINK

(71) Applicant: TEXAS INSTRUMENTS INCORPORATED, Dallas, TX (US)

(72) Inventors: Abishek Manian, Santa Clara, CA (US); Amit Rane, Santa Clara, CA (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 16/599,377

(22) Filed: Oct. 11, 2019

(65) Prior Publication Data
US 2020/0044686 A1 Feb. 6, 2020

Related U.S. Application Data

(63) Continuation of application No. 16/118,621, filed on Aug. 31, 2018, now Pat. No. 10,484,042.

(60) Provisional application No. 62/640,702, filed on Mar. 9, 2018.

(51) Int. Cl.
H04B 1/58 (2006.01)
H04L 25/02 (2006.01)
H03K 19/0175 (2006.01)
H03F 3/45 (2006.01)

(52) U.S. Cl.
CPC ..... *H04B 1/586* (2013.01); *H03K 19/017509* (2013.01); *H04L 25/026* (2013.01); *H03F 3/45076* (2013.01)

(58) Field of Classification Search
CPC . H04B 1/38; H04B 1/586; H04B 1/58; H04B 1/54; H04B 1/48; H04B 1/44; H04B 1/40; H03K 19/0175; H03K 19/017509; H03K 19/017518; H03K 19/017527; H03K 19/01759; H04L 25/026; H04L 25/0262; H04L 25/0264
USPC ............................................. 327/66; 375/257
See application file for complete search history.

(56) References Cited

U.S. PATENT DOCUMENTS

| 7,719,313 | B2 | 5/2010 | Narathong et al. |
| 8,279,642 | B2 | 10/2012 | Chapman et al. |
| 2005/0135489 | A1* | 6/2005 | Ho .......................... H04L 5/20 375/257 |
| 2007/0297520 | A1 | 12/2007 | Ho et al. |

(Continued)

OTHER PUBLICATIONS

International Search Report in corresponding PCT Application No. PCT/US2019/021593, dated Jun. 6, 2019 (2 pages).

*Primary Examiner* — Tomi Skibinski
(74) *Attorney, Agent, or Firm* — Ray A. King; Charles A. Brill; Frank D. Cimino

(57) ABSTRACT

A bidirectional data link includes a forward channel transmitter circuit and a forward channel receiver circuit. The forward channel transmitter circuit includes a forward channel driver circuit, and a back channel receiver circuit. The back channel receiver circuit is coupled to the forward channel driver circuit. The back channel receiver circuit includes a summation circuit and an active filter circuit. The summation circuit is coupled to the forward channel driver circuit. The active filter circuit is coupled to the summation circuit. The forward channel receiver circuit includes a forward channel receiver, and a back channel driver circuit. The back channel driver circuit is coupled to the forward channel receiver.

10 Claims, 5 Drawing Sheets

(56) References Cited

U.S. PATENT DOCUMENTS

2014/0253236 A1* 9/2014 Cheeranthodi ......... H03F 1/086
                                                    330/260
2016/0147245 A1* 5/2016 Kundu .................... G05F 3/262
                                                    327/361

* cited by examiner

BIDIRECTIONAL DATA LINK

CROSS-REFERENCE TO RELATED APPLICATIONS

This continuation application claims priority to U.S. patent application Ser. No. 16/118,621, filed Aug. 31, 2018, which claims priority to Provisional Patent Application No. 62/640,702, filed Mar. 9, 2018, both of which are hereby incorporated herein by reference in their entirety.

BACKGROUND

Communication links are common in modern electronic systems. Some communication links are unidirectional (i.e., data flows in only one direction), while other communication links are bidirectional (i.e., data flows in both directions). Bidirectional communication links that share a communication medium must enable data traveling in one direction to be distinguished from data traveling in the opposite direction.

SUMMARY

A data link for simultaneous bidirectional communication via a single-ended coaxial cable is disclosed herein. In one example, a bidirectional data link includes a forward channel transmitter circuit and a forward channel receiver circuit. The forward channel transmitter circuit includes a forward channel driver circuit, and a back channel receiver circuit. The back channel receiver circuit is coupled to the forward channel driver circuit. The back channel receiver circuit includes a summation circuit and an active filter circuit. The summation circuit is coupled to the forward channel driver circuit. The active filter circuit is coupled to the summation circuit. The forward channel receiver circuit includes a forward channel receiver, and a back channel driver circuit. The back channel driver circuit is coupled to the forward channel receiver.

In another example, a transceiver circuit includes a forward channel driver circuit and a back channel receiver circuit. The forward channel driver circuit includes a differential output. The back channel receiver circuit is coupled to the differential output. The back channel receiver circuit includes a summation circuit and an active filter circuit. The active filter circuit is coupled to the summation circuit.

In a further example, a transceiver circuit includes a forward channel receiver circuit and a back channel driver circuit. The forward channel receiver circuit includes an input terminal. The back channel driver circuit is coupled to the forward channel receiver circuit. The back channel driver circuit includes an output terminal and a differential current-mode drive circuit. The output terminal is coupled to the input terminal of the forward channel receiver circuit. The differential current-mode drive circuit is coupled to the output terminal. The differential current-mode drive circuit includes a plurality of drive transistor and a plurality of degeneration resistors. Each of the drive transistors includes a first terminal. Each of the degeneration resistors includes a first terminal coupled to the first terminal of one of the drive transistors, and a second terminal coupled to ground.

In a yet further example, a back channel communication system includes a back channel driver circuit and a back channel receiver circuit. The back channel driver circuit includes a plurality of drive transistor and a plurality of degeneration resistors. Each of the drive transistors includes a first terminal. Each of the degeneration resistors includes a first terminal coupled to the first terminal of one of the drive transistors, and a second terminal coupled to ground. The back channel receiver includes a summation circuit and an active filter circuit. The active filter circuit is coupled to the summation circuit.

BRIEF DESCRIPTION OF THE DRAWINGS

For a detailed description of various examples, reference will now be made to the accompanying drawings in which.

DETAILED DESCRIPTION

Figure 1:
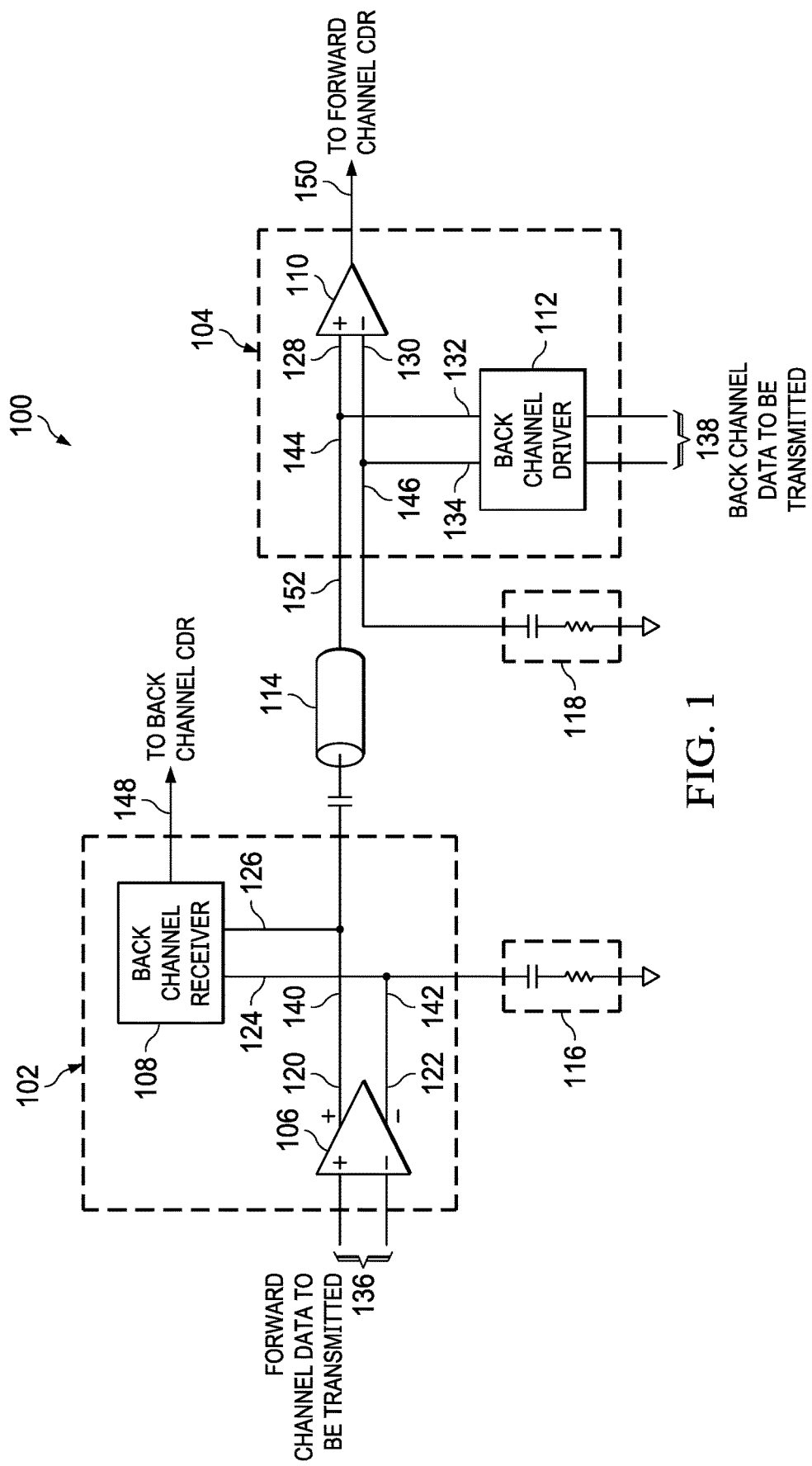
FIG. 1 shows a block diagram for a bidirectional data link in accordance with the present disclosure.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . " Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

Systems employ a variety of approaches to bidirectional signaling. Time division multiplexing reserves the communication media for transmission in only one direction at any given time. For example, 95% of the time the communication medium may be reserved for forward channel use, and 5% of the time the communication medium may be reserved for back channel use. Time division multiplexing may require handshaking to coordinate switching between the forward and back channels without loss of data. Frequency division multiplexing uses different carrier frequencies to simultaneously transmit forward and back channel data. However, it can be difficult to achieve high bandwidths using frequency division multiplexing. Active cancellation uses replica transmitters at each end of the link to subtract transmitted data from received data. While active cancellation allows simultaneous bidirectional communication with forward and back channel, the replica and cancellation circuits require additional power and circuit area, and can be difficult to implement in single-ended systems or at high data rates (e.g., >10 Gb/s).

The bidirectional link circuitry disclosed herein provides simultaneous bidirectional signaling on a single-ended medium (e.g., a coaxial cable) without use of replica circuits. The bidirectional link circuitry includes a forward channel transmitter and a forward channel receiver. The forward channel transmitter includes a driver that transmits forward channel data a relatively high rate (e.g., >3 gigabits/second (Gb/s)), and a back channel receiver. The back channel data rate may be substantially lower (e.g., about 300 megabits/s (Mb/s)) than the forward channel data rate. The back channel receiver extracts the back channel data from the single-ended medium by summing an inverted version of the signal transmitted on the forward channel and the signal on the single-ended medium, and low pass filtering the sum of the signals to remove high frequency noise generated by the forward channel. The forward channel receiver includes a receiver circuit to receive the forward channel data and a current-mode back channel driver to transmit back channel data. The back channel driver includes degeneration to reduce noise induced in the forward channel.

FIG. 1 shows a block diagram for a bidirectional data link 100 in accordance with the present disclosure. The bidirectional data link 100 includes a forward channel transmitter circuit 102 and a forward channel receiver circuit 104. Communication between the forward channel transmitter circuit 102 and the forward channel transmitter circuit 102 is single-ended via a coaxial cable 114 or other suitable conductor. The forward channel transmitter circuit 102 includes a forward channel driver circuit 106 and a back channel receiver circuit 108. The forward channel driver circuit 106 is voltage-mode or current-mode driver that receives data to be transmitted, and drives the data onto the coaxial cable 114. The forward channel driver circuit 106 is a differential driver. The non-inverting output 120 of the forward channel driver circuit 106 is coupled to and drives the coaxial cable 114, and the inverting output 122 of the forward channel driver circuit 106 is coupled to a termination network 116.

The back channel receiver circuit 108 is coupled to the forward channel driver circuit 106 and receives back channel data transmitted via the coaxial cable 114. More specifically, the back channel receiver circuit 108 includes a first input terminal 124 that is coupled to the inverting output 122 and a second input terminal 126 that is coupled to the non-inverting output 120. The back channel receiver circuit 108 sums the signal received on the coaxial cable 114 (i.e., the signal present on the non-inverting output 120) and the signal present on the inverting output 122 to remove the forward channel data from the signal received via the input terminal 126. The back channel receiver circuit 108 filters the summed signal to attenuate noise generated by the forward channel transmission. The back channel data output by the back channel receiver circuit 108 may be provided to a back channel clock and data recovery (CDR) circuit or other circuitry for processing the back channel data.

The forward channel receiver circuit 104 includes an input terminal 152 for receiving singled ended (unbalanced) forward channel data, a forward channel receiver 110 and a back channel driver circuit 112. The back channel driver circuit 112 includes differential current-mode drive circuit that receives back channel data to be transmitted, and drives the data onto the coaxial cable 114. The back channel driver circuit 112 provides the same signal at the output terminal 132 and the output terminal 134. The output terminal 132 is coupled to the input terminal 152 and to the coaxial cable 114 to drive the back channel data to the forward channel transmitter circuit 102. The output terminal 134 is coupled to the inverting input 130 of the forward channel receiver 110 and to a termination network 118.

The forward channel receiver 110 subtracts the back channel data received on the inverting input 130 from the signal on the coaxial cable 114 received at the non-inverting input 128 (i.e., the combined forward channel data and back channel data) to remove the back channel data from the signal received via the non-inverting input 128. The forward channel data output by the forward channel receiver 110 may be provided to a forward channel clock and data recovery (CDR) circuit or other circuitry for processing the forward channel data.

Figure 2:
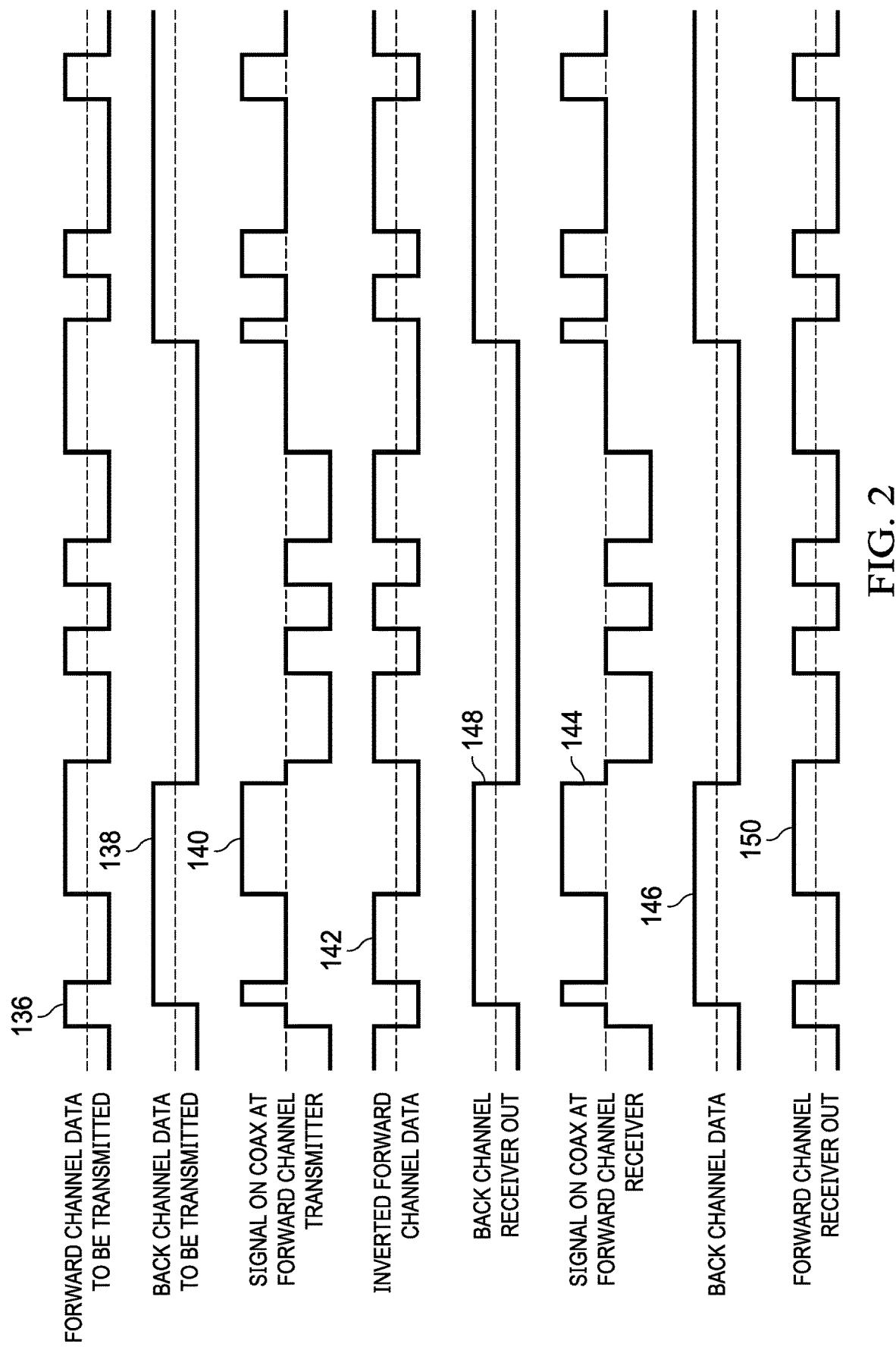
FIG. 2 shows an example of signals that illustrate operation of a bidirectional data link in accordance with the present disclosure.

FIG. 2 shows an example of signals that illustrate operation of a bidirectional data link in accordance with the present disclosure. For simplicity, the signals of FIG. 2 are illustrated with no circuit or cable delays. The forward channel data to be transmitted 136 is driven on the coaxial cable 114 by the forward channel driver circuit 106, and the back channel data to be transmitted 138 is driven onto the coaxial cable 114 by the back channel driver circuit 112. The back channel data to be transmitted 138 may be encoded (e.g., Manchester encoded) to reduce transmission bandwidth and facilitate clock and data recovery. Encoding reduces the bandwidth of the back channel data which reduces the interaction between the forward channel data and the back channel data. The signals sum on the coaxial cable 114 to form the signal 140 at the non-inverting output 120 of the forward channel driver circuit 106 and the signal 144 at the non-inverting input 128 of the forward channel receiver 110. The back channel receiver circuit 108 sums the signal 140 and the inverted forward channel data 142 to recreate the transmitted back channel data as the output signal 148 of the back channel receiver circuit 108. The forward channel receiver 110 subtracts the back channel data signal 146 received on the 130 from the signal 144 received at the non-inverting input 128 to recreate the forward channel data to be transmitted 136 as the output signal 150 of the forward channel receiver 110.

Figure 3:
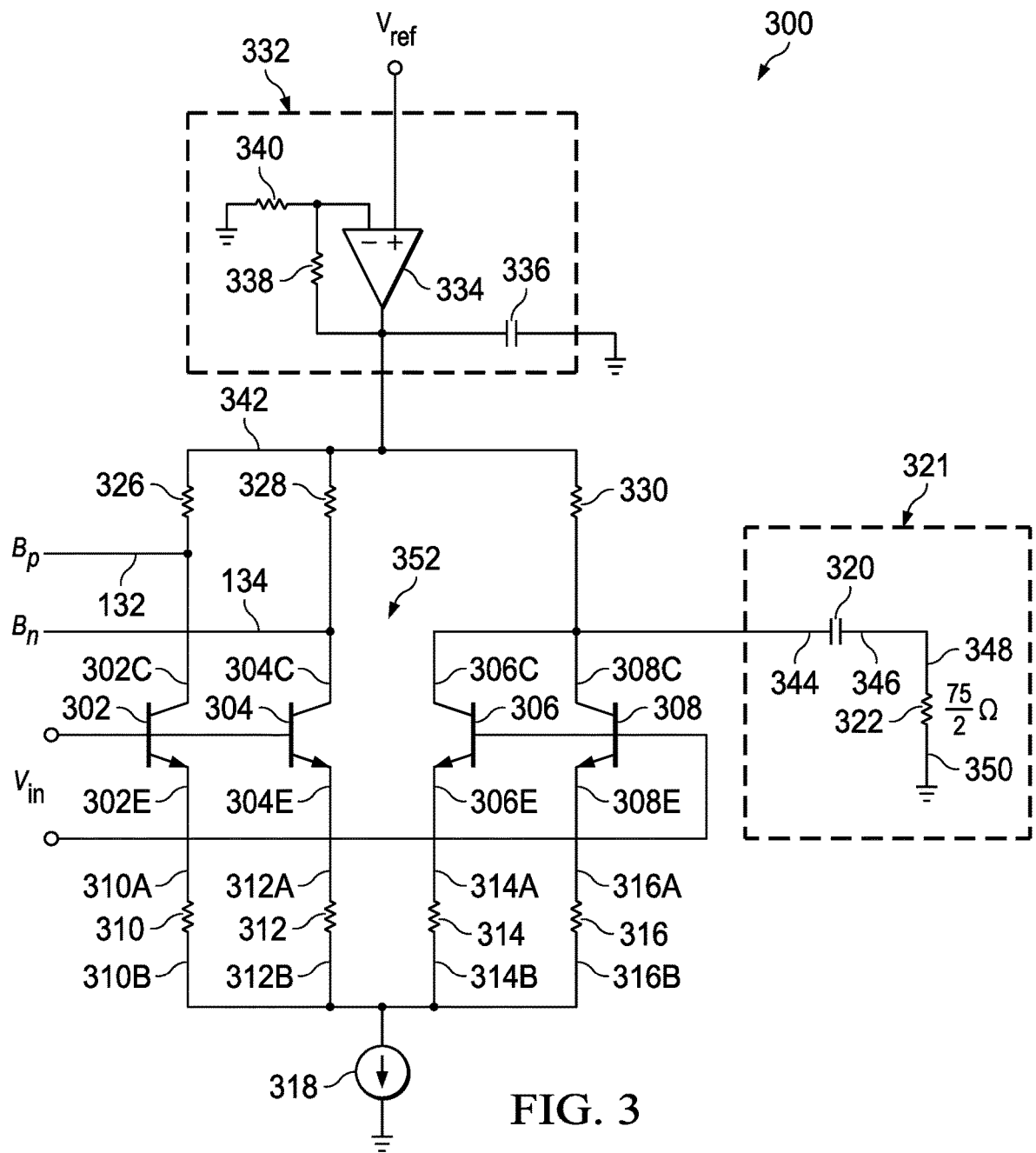
FIG. 3 shows a schematic diagram for a back channel driver suitable for use in a bidirectional data link in accordance with the present disclosure.

FIG. 3 shows a schematic diagram for a back channel driver circuit 300 suitable for use in the bidirectional data link 100. The back channel driver circuit 300 is an implementation of the back channel driver circuit 112. The back channel driver circuit 300 includes a plurality of drive transistors, illustrated in FIG. 3 as transistor 302, transistor 304, transistor 306, and transistor 308, that form a differential current-mode drive circuit 352. The transistor 302 and the transistor 304 are active side transistors that drive common-mode signal onto the output terminal 132 and the output terminal 134 respectively. The transistor 306 and the transistor 308 are dummy side transistors that provide a dummy side of the differential driver formed by the transistors 302-308. The transistor 302 includes a terminal (e.g., a collector terminal) 302C that is coupled to the output terminal 132. The transistor 304 includes a terminal (e.g., a collector terminal) 304C that is coupled to the output terminal 134. The transistor 306 includes a terminal (e.g., a collector terminal) 306C that is coupled to a terminal (e.g., a collector terminal) 308C of the transistor 308.

The back channel driver circuit 300 includes a voltage regulator circuit 332 that sets the output common mode voltage of the back channel driver circuit 300. For example, the voltage regulator circuit 332 may set the output common mode voltage of the back channel driver circuit 300 to about 2.1 volts. The voltage regulator circuit 332 includes an amplifier 334, a capacitor 336, a resistor 338, and a resistor 340. The amplifier 334 drives the output common mode voltage onto the node 342. The resistor 338 and the resistor 340 set the gain of the amplifier 334. The capacitor 336 filters voltage ripple to reduce noise on the node 342.

The transistor 302 is coupled to the 322 via a pull-up resistor 326. The transistor 304 is coupled to the node 342 via a pull-up resistor 328. The pull-up resistor 326 and the pull-up resistor 328 may each have a resistance of about 75 ohms in some implementations of the back channel driver circuit 300. The transistor 306 and the transistor 308 are coupled to the node 342 via a pull-up resistor 330. The pull-up resistor 330 may have a resistance that is about half of the resistance of the pull-up resistor 326 in some implementations.

A termination circuit 321 is coupled to the transistor 306 and the transistor 308 to reduce AC current imbalance in the differential driver. The termination circuit 321 includes a capacitor 320 and a resistor 322. The capacitor 320 is large enough to pass the back channel data, and small enough to be integrated on a die with the back channel driver circuit 300. For example, the capacitor 320 may have capacitance of about 100 pico-farads (pF) to pass back channel data transmitted at 156 Mb/s (312 Mb/s Manchester coded). The capacitor 320 includes a terminal 344 that is coupled to the transistor 306 and the transistor 308 (i.e., terminals 306C and 308C), and a terminal 346 that is coupled to a terminal 348 of the resistor 322. A terminal 350 of the resistor 322 is coupled to ground.

The transistor 302, the transistor 304, the transistor 306, and the transistor 308 are each coupled to a current source 318 and to ground through a degeneration resistor. The degeneration resistors 310-316 reduce noise gain in the back channel driver circuit 300 while maintaining signal swing at the output terminal 132 to substantially reduce the edge jitter in the forward data at the output of the forward channel receiver 110. For example, without the degeneration resistors, the back channel driver circuit 300 may induce about 625 femtoseconds root-mean-squared (RMS) of edge jitter at the output of the forward channel receiver 110. With the degeneration resistors, the edge jitter at the output of the forward channel receiver 110 may be about 300 femtoseconds RMS.

The transistor 302 is coupled to the current source 318 through the degeneration resistor 310. The transistor 304 is coupled to the current source 318 through the degeneration resistor 312. The transistor 306 is coupled to the current source 318 through the degeneration resistor 314. The transistor 308 is coupled to the current source 318 through the degeneration resistor 316. A terminal 310A of the degeneration resistor 310 is coupled to a terminal (i.e., an emitter terminal) 302E of the transistor 302, and a terminal 310B of the degeneration resistor 310 is coupled to ground via the current source 318. A terminal 312A of the degeneration resistor 312 is coupled to a terminal (i.e., an emitter terminal) 304E of the transistor 304, and a terminal 312B of the degeneration resistor 312 is coupled to ground via the current source 318. A terminal 314A of the degeneration resistor 314 is coupled to a terminal (i.e., an emitter terminal) 306E of the transistor 306, and a terminal 314B of the degeneration resistor 314 is coupled to ground via the current source 318. A terminal 316A of the degeneration resistor 316 is coupled to a terminal (i.e., an emitter terminal) 308E of the transistor 308, and a terminal 316B of the degeneration resistor 316 is coupled to ground via the current source 318.

Figure 4:
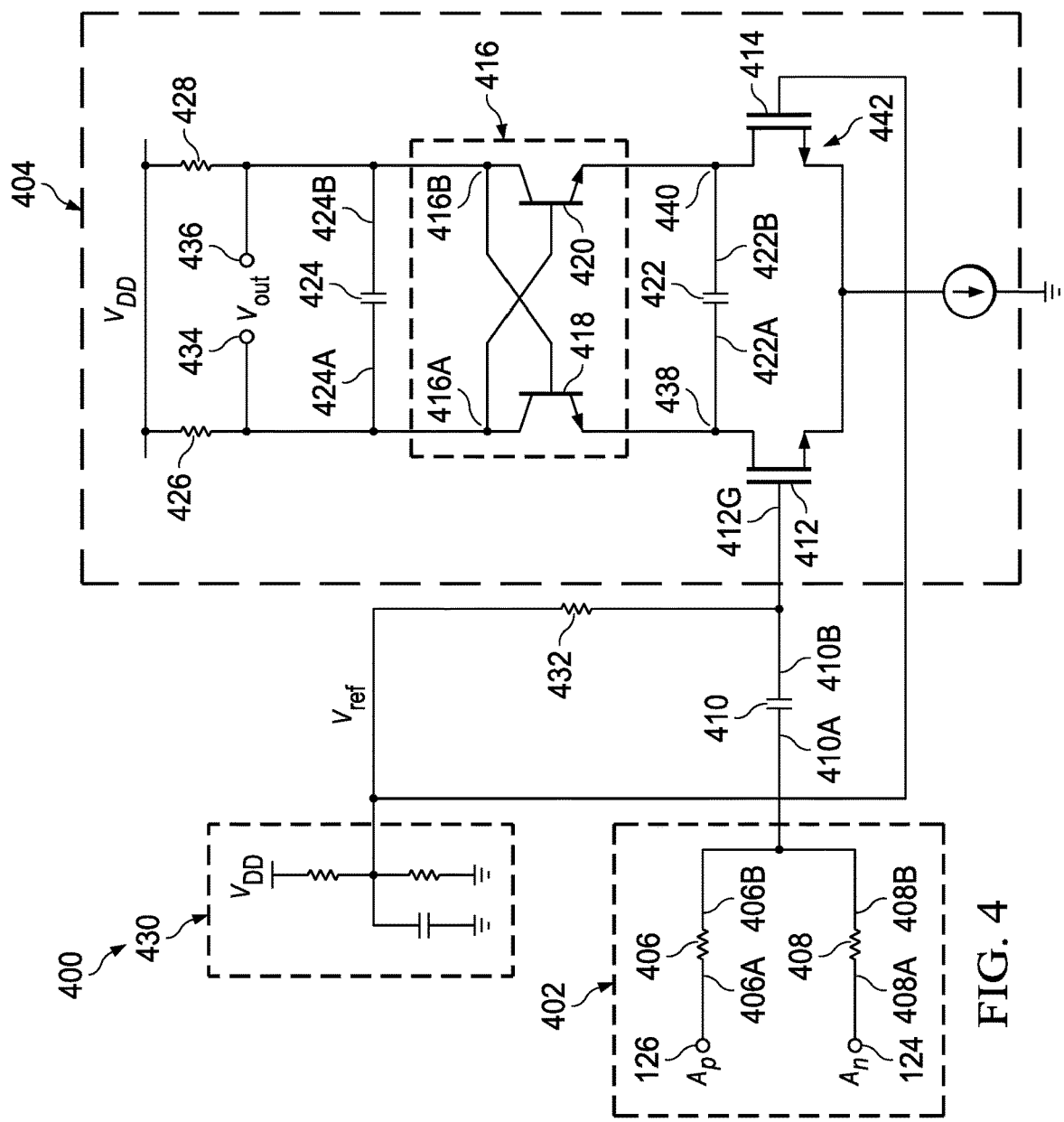
FIG. 4 shows a schematic diagram for a back channel receiver suitable for use in a bidirectional data link in accordance with the present disclosure.

FIG. 4 shows a schematic diagram for a back channel receiver 400 suitable for use in the bidirectional data link 100. The back channel receiver 400 is an implementation of the back channel receiver circuit 108. The back channel receiver 400 includes a summation circuit 402, an active filter circuit 404, and a reference voltage circuit 430. The summation circuit 402 averages the signals received at the input terminal 124 and the input terminal 126. In the bidirectional data link 100, the input terminal 124 is connected to the inverting output 122 of the forward channel driver circuit 106 and the input terminal 126 is connected to the non-inverting output 120 of the forward channel driver circuit 106 (which is connected to the coaxial cable 114). In the bidirectional data link 100, summation of the signal at the non-inverting output 120 and the signal at the inverting output 122 substantially removes the forward channel data 136 from the output signal of the summation circuit 402 (leaving the back channel data 138). The summation circuit 402 includes a resistor 406, a resistor 408. The resistor 406 includes a terminal 406A that is coupled to the input terminal 126. The resistor 408 includes a terminal 408A that is coupled to the input terminal 124. A terminal 406B of the resistor 406 and a terminal 408B of the resistor 408 are coupled to a terminal 410A of the capacitor 410. A capacitor 410 couples the summation circuit 402 to the active filter circuit 404. The reference voltage circuit 430 is coupled to terminal 410B of the capacitor 410 and to terminal (i.e., gate terminal 412G) of the transistor 412 via a resistor 432. In some implementations, the capacitor 410 may have a value of about 2 pF, and the resistor 406 and resistor 408 may each have a value of about 5 kilo ohms.

The active filter circuit 404 attenuates frequencies in the signal received from the summation circuit 402 that are outside a bandwidth of the back channel data. For example, for back channel data transmitted at 156 Mb/s (312 Mb/s Manchester coded), the active filter circuit 404 attenuates frequencies above the data rate of the Manchester coded back channel data, which includes the forward channel data transmitted by the forward channel driver circuit 106. The active filter circuit 404 includes a transistor 412, a transistor 414, a transistor 418, and a transistor 420. The transistor 412 and the transistor 414 are arranged to form a differential amplifier 442. The transistor 412 is coupled to, and controlled by the signal produced by, the summation circuit 402. The transistor 414 is coupled to the reference voltage circuit 430. The capacitor 422 is connected across the outputs of the differential amplifier 442 formed by the transistor 412 and the transistor 414. Terminal 422A of the capacitor 422 is connected to output 438 of the differential amplifier 442 and terminal 422B of the capacitor 422 is connected to output 440 of the differential amplifier 442. In some implementations the capacitor 422 may have a value of about 65 femtofarads (fF).

The transistor 418 and the transistor 420 that are cross-coupled to form a cross-coupled pair 416. The cross-coupled pair 416 is coupled to the transistor 412 and the transistor 414. A capacitor 424 is coupled to the output terminals of the cross-coupled pair 416. Terminal 424A of the capacitor 424 is connected to output 416A of the cross-coupled pair 416 and terminal 424B of the capacitor 424 is connected to output 416B of the cross-coupled pair 416. The capacitor 424 may have a value of about 130 fF in some implementations. Output terminal 434 and output terminal 436 provide the output of the cross-coupled pair 416 to circuitry external to the back channel receiver 400. In implementations of the back channel receiver 400 that include a 130 fF capacitor 424, a 65 fF capacitor 422, and a 2 pF capacitor 410, the corner frequency of the back channel receiver 400 may be about 290 megahertz (MHz), which passes 312 Mb/s Manchester encoded back channel data.

Figure 5:
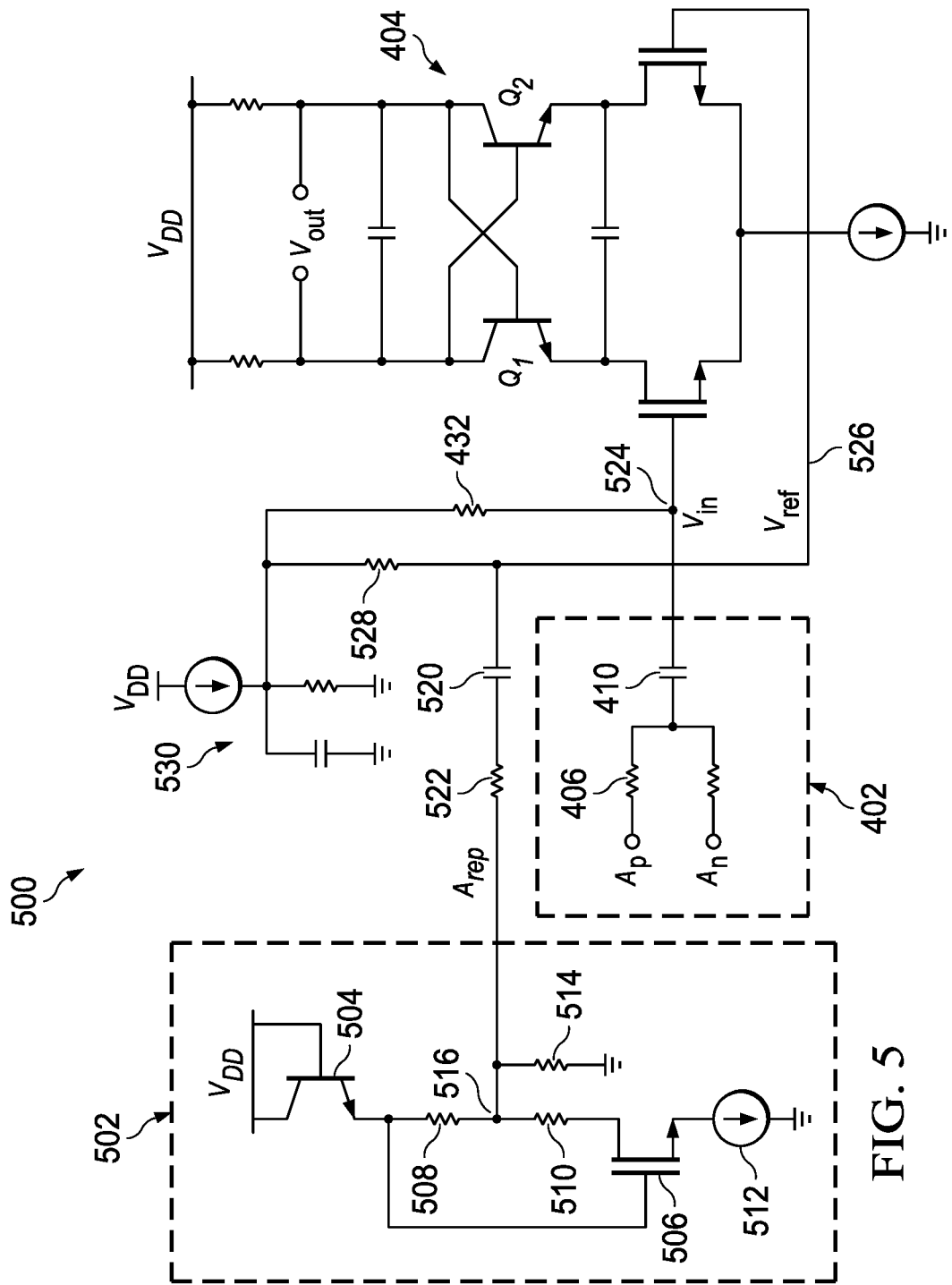
FIG. 5 shows a schematic diagram for a back channel receiver suitable for use in a bidirectional data link that includes a driver replica circuit in accordance with the present disclosure.

FIG. 5 shows a schematic diagram for a back channel receiver 500 that suitable for use in the bidirectional data link 100. The back channel receiver 500 is an implementation of the back channel receiver circuit 108. The back channel receiver 500 may provide an improved power supply rejection ratio (PSRR) relative to some implementations of the back channel receiver circuit 108 in which the transfer function from the power supply to Vref (node 526) differs from the transfer function from the power supply to Vin (node 524). The back channel receiver 500 includes a summation circuit 402 and an active filter circuit 404 as described with regard to the back channel receiver 400, a reference voltage circuit 530, and a replica driver circuit 502. The reference voltage circuit 530 is coupled to the active filter circuit 404 by a resistor 432 and a resistor 528.

Figure 6:
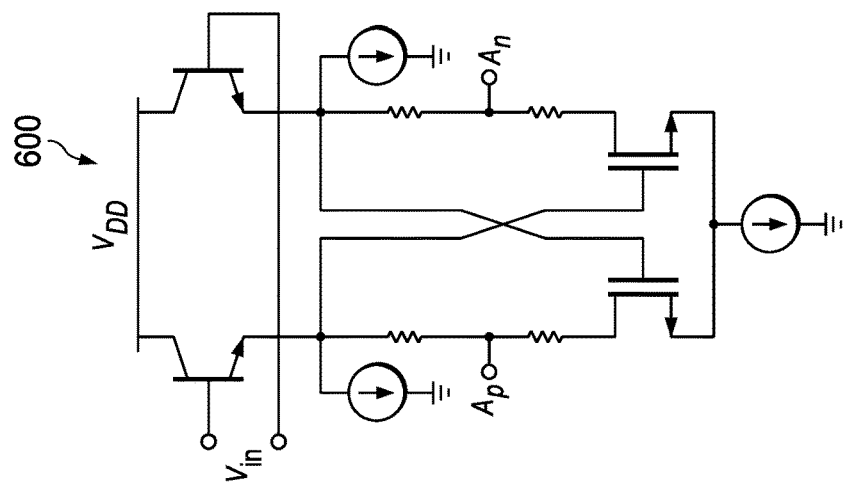
FIG. 6 shows an example of a voltage mode driver circuit suitable for use in a forward channel transmitter in accordance with the present disclosure.

The replica driver circuit 502 is coupled to the node 526 to improve matching of the transfer function from the power supply to node 526 and the transfer function from the power supply to the node 524. The replica driver circuit 502 is a scaled replica of a portion of the forward channel driver circuit 106. FIG. 6 shows a schematic for an example of a driver circuit 600 that may be used to implement the forward channel driver circuit 106. To save power, the replica driver circuit 502 may a scaled down (e.g., scaled down by 22x) replica of one leg of the 600. The replica driver circuit 502 includes a transistor 504, a transistor 506, a resistor 508, a resistor 510, a resistor 514, and a current source 512. The transistor 504 is diode connected, with a terminal (e.g., collector terminal) 504C and a terminal (e.g., base terminal) 504B connected to a power supply rail. A terminal (e.g., emitter terminal) 504E of the transistor 504 is connected to the terminal (e.g., gate terminal) 506G of the transistor 506, and is coupled to a terminal (e.g., drain terminal) 506D of the transistor 506 via the resistor 508 and the resistor 510. A terminal (e.g., source terminal) 506S of the transistor 506 is coupled to ground via the current source 512. The resistor 514 is connected between ground and the node 516, which connects the resistor 508 and the resistor 510.

The replica driver circuit 502 (i.e., the node 516) is coupled to the node 526 by the resistor 522 and the capacitor 520. The resistor 522 may have a value of 5 kilo ohms, and the capacitor 520 may have a value of 2 pf to match the values of the resistor 406 and the capacitor 410 of the summation circuit 402. The back channel receiver 500 may provide over 20 dB of improvement in PSRR relative to some implementations of the back channel receiver circuit 108.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A bidirectional data link, comprising:
   a forward channel transmitter circuit, including:
      a forward channel driver circuit; and
      a back channel receiver circuit coupled to the forward channel driver circuit, the back channel receiver circuit including:
         a summation circuit coupled to the forward channel driver circuit; and
         an active filter circuit coupled to the summation circuit; and
   a forward channel receiver circuit, including:
      a forward channel receiver; and
      a back channel driver circuit coupled to the forward channel receiver, the back channel driver having active side transistors driving a common mode signal and dummy side transistors.

2. The bidirectional data link of claim 1, wherein the active filter circuit includes:
   a first transistor coupled to the summation circuit;
   a second transistor coupled to the first transistor to form a differential amplifier; and
   a first capacitor coupled to outputs of the differential amplifier.

3. A transceiver circuit, including:
   a forward channel driver circuit comprising a differential output; and
   a back channel receiver circuit coupled to the differential output, the back channel receiver circuit including:
      a replica driver circuit providing a scaled replica of at least a portion of the forward channel drive circuit;
      a summation circuit; and
      an active filter circuit coupled to the summation circuit.

4. The transceiver circuit of claim 3, wherein the summation circuit includes:
   a first resistor having a first terminal coupled to the positive terminal of the differential output; and
   a second resistor having:
      a first terminal coupled to the negative terminal of the differential output; and
      a second terminal coupled to a second terminal of the first resistor.

5. The transceiver circuit of claim 3, wherein the active filter circuit includes:
   a first transistor coupled to the summation circuit, wherein the first transistor is controlled by an output signal produced by the summation circuit;
   a second transistor coupled to a reference voltage source, and coupled to the first transistor to form a differential amplifier; and
   a first capacitor having:
      a first terminal coupled to a first output of the differential amplifier; and
      a second terminal coupled to a second output of the differential amplifier.

6. A bidirectional data link, comprising:
   a forward channel driver circuit having an input terminal coupled to a first data channel terminal, a forward channel driver positive output terminal, and a forward channel driver negative output terminal configured to be coupled to a first end of a single-ended transmission medium;
   a back channel receiver circuit having a first input coupled to the forward channel driver positive output terminal, a second input coupled to the forward channel driver negative output terminal, and generating a back channel receiver output signal at a back channel receiver output terminal, wherein the back channel receiver output signal is generated by summing the signals at the forward channel driver positive output terminal and the forward channel driver negative output terminal;
   a forward channel receiver circuit having a first input terminal configured to be coupled to a second end of the single-ended transmission medium, a second input terminal, and a forward channel receiver output terminal, wherein the signal at the forward channel receiver output terminal is the difference between the signals at the first input terminal and the second input terminal;

a back channel driver circuit having an input terminal coupled to a second data channel terminal, a first output terminal coupled to the first input terminal of the forward channel receiver circuit, and a second output terminal coupled to the second terminal of the forward channel receiver circuit.

7. The bidirectional data link of claim 6, including a first termination network coupled to the forward channel driver negative output terminal and a second termination network coupled to the second output terminal of the back channel driver circuit.

8. The bidirectional data link of claim 6, including an active filter circuit having an input configured to receive the back channel receiver output signal and an output coupled to the back channel receiver output terminal.

9. The bidirectional data link of claim 6, wherein the back channel receiver output terminal is configured to be coupled to a clock and data recovery circuit.

10. The bidirectional data link of claim 6, wherein the single-ended transmission medium is a coaxial cable.

* * * * *